(12) United States Patent
Lu

(10) Patent No.: US 9,366,783 B2
(45) Date of Patent: Jun. 14, 2016

(54) SILICON THIN FILM SOLAR CELL HAVING IMPROVED UNDERLAYER COATING

(71) Applicant: PPG INDUSTRIES OHIO, INC., Cleveland, OH (US)

(72) Inventor: Songwei Lu, Wexford, PA (US)

(73) Assignee: PPG industries Ohio, Inc., Cleveland, OH (US)

( * ) Notice: Subject to any disclaimer, the term of this patent is extended or adjusted under 35 U.S.C. 154(b) by 283 days.

(21) Appl. No.: 13/678,681

(22) Filed: Nov. 16, 2012

(65) Prior Publication Data

US 2013/0316140 A1 Nov. 28, 2013

Related U.S. Application Data

(63) Continuation-in-part of application No. 12/643,448, filed on Dec. 21, 2009.

(51) Int. Cl.
*B32B 7/02* (2006.01)
*G02B 1/10* (2015.01)
*H01L 31/0216* (2014.01)
*C03C 17/34* (2006.01)
(Continued)

(52) U.S. Cl.
CPC ............. *G02B 1/10* (2013.01); *C03C 17/3417* (2013.01); *H01L 31/02168* (2013.01); *H01L 31/022466* (2013.01); *H01L 31/03921* (2013.01); *H01L 31/1884* (2013.01); *C03C 2217/94* (2013.01); *G02B 1/115* (2013.01); *Y02E 10/50* (2013.01); *Y10T 428/24364* (2015.01); *Y10T 428/24975* (2015.01); *Y10T 428/265* (2015.01)

(58) Field of Classification Search
CPC ............. C03C 17/3417; C03C 17/366; C03C 17/3681; C03C 2217/734; C03C 2217/94; H01L 31/022466; H01L 31/03921; H01L 31/1884; H01L 31/02168; G02B 1/10; G02B 1/115; Y10T 428/24975; Y10T 428/265; Y10T 428/24364; Y02E 10/50
USPC ............................ 136/255; 428/142, 215, 216
See application file for complete search history.

(56) References Cited

U.S. PATENT DOCUMENTS

| 3,378,396 | A | | 4/1968 | Zaromb |
| 4,187,336 | A | * | 2/1980 | Gordon ................. C03C 17/002 359/359 |

(Continued)

FOREIGN PATENT DOCUMENTS

EP 1 950 813 A1 7/2008

OTHER PUBLICATIONS

PCT International Search Report, PCT/US2010/059081, dated Apr. 20, 2012.

*Primary Examiner* — Devina Pillay
(74) *Attorney, Agent, or Firm* — Andrew C. Siminerio

(57) ABSTRACT

A silicon thin film solar cell includes a substrate and an undercoating formed over the substrate. The undercoating includes first layer of tin oxide or titania and a second layer having a mixture of oxides of at least two of Sn, P, Si, Ti, Al, and Zr. A conductive coating is over the first coating. The conductive coating includes oxides of one or more of Zn, Fe, Mn, Al, Ce, Sn, Sb, Hf, Zr, Ni, Zn, Bi, Ti, Co, Cr, Si, or In or an alloy of two or more of these materials. A coated article has a substrate and an anti-iridescent layer formed over the substrate. The anti-iridescent layer has a metal oxide film and a homogeneous mixed oxide film. A functional film is over the anti-iridescent layer.

4 Claims, 2 Drawing Sheets

(51) Int. Cl.
*H01L 31/0224* (2006.01)
*H01L 31/0392* (2006.01)
*H01L 31/18* (2006.01)
*G02B 1/115* (2015.01)

(56) References Cited

U.S. PATENT DOCUMENTS

| | | | |
|---|---|---|---|
| 4,206,252 A | 6/1980 | Gordon | |
| 4,746,347 A | 5/1988 | Sensi | |
| 4,792,536 A | 12/1988 | Pecoraro et al. | |
| 4,853,257 A | 8/1989 | Henery | |
| 4,971,843 A | 11/1990 | Michelotti et al. | |
| 5,030,593 A | 7/1991 | Heithoff | |
| 5,030,594 A | 7/1991 | Heithoff | |
| 5,240,886 A | 8/1993 | Gulotta et al. | |
| 5,385,872 A | 1/1995 | Gulotta et al. | |
| 5,393,593 A | 2/1995 | Gulotta et al. | |
| 5,401,305 A * | 3/1995 | Russo et al. | 106/287.1 |
| 5,464,657 A | 11/1995 | Athey et al. | |
| 5,599,387 A | 2/1997 | Neuman et al. | |
| 5,714,199 A | 2/1998 | Gerhardinger et al. | |
| 6,106,892 A * | 8/2000 | Ye | C03C 17/245 427/109 |
| 6,165,598 A * | 12/2000 | Nelson | 428/212 |
| 6,797,388 B1 * | 9/2004 | Szanyi et al. | 428/432 |
| 2005/0029613 A1 | 2/2005 | Fujisawa et al. | |
| 2006/0065299 A1 * | 3/2006 | Fukawa | C03C 17/3417 136/256 |
| 2008/0088932 A1 * | 4/2008 | Cho | G02B 1/113 359/586 |

* cited by examiner

SILICON THIN FILM SOLAR CELL HAVING IMPROVED UNDERLAYER COATING

CROSS-REFERENCE TO RELATED APPLICATION

This application is a continuation-in-part of U.S. application Ser. No. 12/643,448 filed Dec. 21, 2009, herein incorporated by reference in its entirety.

BACKGROUND OF THE INVENTION

1. Field of the Invention

This invention relates generally to coated articles such as solar cells and solar control transparencies. In one particular embodiment, the invention relates to an amorphous silicon thin film solar cell having an improved underlayer structure. In another embodiment, the invention relates to a solar control transparency having an improved anti-iridescent undercoating.

2. Technical Considerations

A conventional amorphous silicon thin film solar cell typically includes a glass substrate over which is provided a transparent conductive oxide (TCO) contact layer and an amorphous silicon thin film active layer having a p-n junction. A rear metallic layer acts as a reflector and back contact. The TCO has an irregular surface to increase light scattering. In solar cells, light scattering or "haze" is used to trap light in the active region of the cell. The more light that is trapped in the cell, the higher the efficiency that can be obtained. However, the haze cannot be so great as to adversely impact upon the transparency of light through the TCO. Therefore, light trapping is an important issue when trying to improve the efficiency of solar cells and is particularly important in thin film cell design. However, with thin film devices, this light trapping is more difficult because the layer thicknesses are much thinner than those in previously known monocrystalline devices. As the film thicknesses are reduced, they tend toward coatings having predominantly parallel surfaces. Such parallel surfaces typically do not provide significant light scattering.

Another important feature for thin film solar cells is surface resistivity of the TCO. When the cell is irradiated, electrons generated by the irradiation move through the silicon and into the transparent conductive films. It is important for photoelectric conversion efficiency that the electrons move as rapidly as possible through the conductive film. That is, it is desirable if the surface resistivity of the transparent conductive film is low. It is also desirable if the conductive film is highly transparent to permit the maximum amount of solar radiation to pass to the silicon layer.

Conventional solar control transparencies, e.g., glass panels having a solar control coating, can have undesirable iridescence.

Therefore, it would be desirable to provide a coating configuration for a solar cell that enhances electron flow through the transparent conductive oxide, while also enhancing the light scattering and transparency characteristics of the solar cell. It would also be desirable to provide an anti-iridescent undercoating that could be used for solar cells or solar control transparencies.

SUMMARY OF THE INVENTION

A coated article comprises a substrate and an undercoating, such as an anti-iridescent layer, formed over at least a portion of the substrate. The undercoating comprises a metal oxide film over at least a portion of the substrate and a homogeneous mixed oxide film over at least a portion of the metal oxide film. A functional film is formed over at least a portion of the anti-iridescent layer, such as over at least a portion of the homogeneous mixed oxide film.

Another coated article comprises a substrate and an undercoating, such as an anti-iridescent layer, formed over at least a portion of the substrate. The undercoating comprises a first layer comprising tin oxide or titania and a second layer comprising a homogeneous mixture of oxides comprising oxides of at least two of Sn, P, Si, Ti, Al and Zr. A conductive coating is formed over at least a portion of the first coating. The conductive coating comprises oxides of one or more of Zn, Fe, Mn, Al, Ce, Sn, Sb, Hf, Zr, Ni, Zn, Bi, Ti, Co, Cr, Si or In or an alloy of two or more of these materials. In one particular coated article, the substrate is glass, the first layer comprises tin oxide having a thickness in the range of 10 nm to 20 nm, the second layer comprises a homogeneous mixture of silica, tin oxide, and phosphorous oxide having a thickness in the range of 35 nm to 45 nm and having tin oxide in the range of 35 mole % to 45 mole %, such as 40 mole %, and the conductive coating comprises fluorine doped tin oxide having a thickness in the range of 200 nm to 300 nm. The coated article has a color defined by a* in the range of −2 to 0, b* in the range of −5 to 0, and L* in the range of 39 to 45.

BRIEF DESCRIPTION OF THE DRAWINGS

A complete understanding of the invention will be obtained from the following description when taken in connection with the accompanying drawing figures.

DESCRIPTION OF THE PREFERRED EMBODIMENTS

Figure 1:
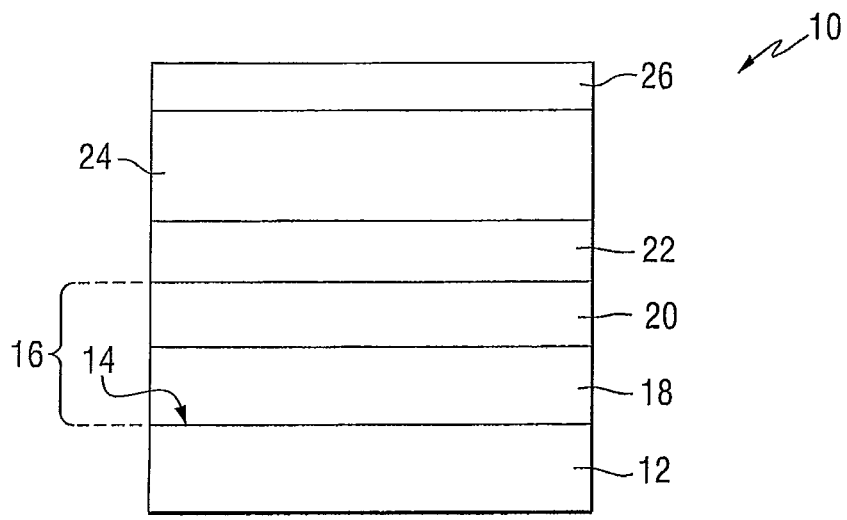
FIG. 1 is a side, sectional view (not to scale) of a solar cell incorporating an undercoating of the invention.

As used herein, spatial or directional terms, such as "left", "right", "inner", "outer", "above", "below", and the like, relate to the invention as it is shown in the drawing figures. However, it is to be understood that the invention can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like. Further, as used herein, the terms "formed over", "deposited over", or "provided over" mean formed, deposited, or provided on but not necessarily in direct contact with the surface. For example, a coating layer "formed over" a substrate does not preclude the presence of one or more other coating layers or films of the same or different composition located between the formed coating layer and the substrate. A coating formed over "at least a portion" of an underlying structure means that the coating can be formed over all of the underlying structure or only over a portion of the underlying structure. As used herein, the terms "polymer" or "polymeric" include oligomers, homopolymers, copolymers, and terpolymers, e.g., polymers formed from two or more types of monomers or polymers. The terms "visible region" or "visible light" refer to electromagnetic radiation having a wavelength in the range of 380 nm to 760 nm. The terms "infrared region" or "infrared radiation" refer to electromagnetic radiation having a wavelength in the range of greater than 760 nm to 100,000 nm. The terms "ultraviolet region" or "ultraviolet radiation" mean electromagnetic energy having a wavelength in the range of 200 nm to less than 380 nm. The terms "microwave region" or "microwave radiation" refer to electromagnetic radiation having a frequency in the range of 300 megahertz to 300 gigahertz. Additionally, all documents, such as, but not limited to, issued patents and patent applications, referred to herein are to be considered to be "incorporated by reference" in their entirety. In the following discussion, the refractive index values are those for a reference wavelength of 550 nanometers (nm). The term "film" refers to a region of a coating having a desired or selected composition. A "layer" comprises one or more "films". A "coating" or "coating stack" is comprised of one or more "layers". A "solar control coating" refers to a coating that affects the solar properties of a coated substrate, such as the transmission or reflection of solar radiation, e.g., infrared radiation, ultraviolet radiation, visible radiation, etc.

Although the undercoating and a coated substrate incorporating the undercoating of the invention will be described with respect to use in a solar cell, it is to be understood that the undercoating and a coated substrate are not limited to use with solar cells but could be used in other applications, such as architectural glazings or solar control transparencies. For example, the undercoating could be used as an anti-iridescence undercoating on a solar control architectural transparency.

An exemplary solar cell 10 incorporating features of the invention is shown in FIG. 1. The solar cell 10 includes a substrate 12 having at least one major surface 14. An undercoating 16 of the invention is formed over at least a portion of the major surface 14. In the illustrated embodiment, the undercoating 16 is illustrated as a multilayer coating, e.g., a bilayer coating, having a first layer 18 and a second layer 20. A transparent conductive oxide (TCO) coating 22 is formed over at least a portion of the undercoating 16. A layer of amorphous silicon 24 is formed over at least a portion of the TCO coating 22. A metal or metal-containing layer 26 is formed over at least a portion of the amorphous silicon layer 24.

In the broad practice of the invention, the substrate 12 can include any desired material having any desired characteristics. For example, the substrate can be transparent or translucent to visible light. By "transparent" is meant having a visible light transmittance of greater than 0% up to 100%. Alternatively, the substrate 12 can be translucent. By "translucent" is meant allowing electromagnetic energy (e.g., visible light) to pass through but diffusing this energy such that objects on the side opposite the viewer are not clearly visible. Examples of suitable materials include, but are not limited to, plastic substrates (such as acrylic polymers, such as polyacrylates; polyalkylmethacrylates, such as polymethylmethacrylates, polyethylmethacrylates, polypropylmethacrylates, and the like; polyurethanes; polycarbonates; polyalkylterephthalates, such as polyethyleneterephthalate (PET), polypropyleneterephthalates, polybutyleneterephthalates, and the like; polysiloxane-containing polymers; or copolymers of any monomers for preparing these, or any mixtures thereof); glass substrates; or mixtures or combinations of any of the above. For example, the substrate 12 can include conventional soda-lime-silicate glass, borosilicate glass, or leaded glass. The glass can be clear glass. By "clear glass" is meant non-tinted or non-colored glass. Alternatively, the glass can be tinted or otherwise colored glass. The glass can be annealed or heat-treated glass. As used herein, the term "heat treated" means tempered or at least partially tempered. The glass can be of any type, such as conventional float glass, and can be of any composition having any optical properties, e.g., any value of visible transmission, ultraviolet transmission, infrared transmission, and/or total solar energy transmission. By "float glass" is meant glass formed by a conventional float process in which molten glass is deposited onto a molten metal bath and controllably cooled to form a float glass ribbon. Although not limiting to the invention, examples of glass suitable for the substrate are described in U.S. Pat. Nos. 4,746,347; 4,792,536; 5,030,593; 5,030,594; 5,240,886; 5,385,872; and 5,393,593. Non-limiting examples of glass that can be used for the practice of the invention include Solargreen®, Solextra®, GL-20®, GL-35™, Solarbronze®, Starphire®, Solarphire®, Solarphire PV® and Solargray® glass, all commercially available from PPG Industries Inc. of Pittsburgh, Pa.

The substrate 12 can be of any desired dimensions, e.g., length, width, shape, or thickness. For example, the substrate 12 can be planar, curved, or have both planar and curved portions. In one non-limiting embodiment, the substrate 12 can have a thickness in the range of 0.5 mm to 10 mm, such as 1 mm to 5 mm, such as 2 mm to 4 mm, such as 3 mm to 4 mm.

The substrate 12 can have a high visible light transmission at a reference wavelength of 550 nanometers (nm). By "high visible light transmission" is meant visible light transmission at 550 nm of greater than or equal to 85%, such as greater than or equal to 87%, such as greater than or equal to 90%, such as greater than or equal to 91%, such as greater than or equal to 92%.

In the practice of the invention, the undercoating 16 is a multilayer coating having two or more coating layers. The first layer 18 can provide a barrier between the substrate 12 and the overlying coating layers. Silica is known to provide good barrier properties, particularly as a barrier to sodium ion diffusion out of a glass substrate. However, silica presents deposition difficulties. In the practice of the invention, the first layer 16 is an oxide of at least one material selected from tin or titanium. For example, the first layer 16 can be a tin oxide layer having a thickness of less than 50 nm, such as less than 40 nm, such as less than 30 nm, such as less than 25 nm, such as less than 20 nm, such as less than 15 nm, such as in the range of 5 nm to 25 nm, such as in the range of 5 nm to 15 nm. In another embodiment, the first layer 16 is titania having a thickness of less than 30 nm, such as less than 25 nm, such as less than 20 nm, such as less than 15 nm, such as in the range of 5 nm to 25 nm, such as in the range of 5 nm to 15 nm, such as in the range of 10 nm to 15 nm.

The second layer 20 comprises a mixture of two or more oxides selected from oxides of silicon, titanium, aluminum, tin, zirconium and/or phosphorus. The oxides can be present in any desired proportions. The second layer 20 can be a homogeneous coating, i.e., the components are randomly mixed throughout the coating. Alternatively, the second layer 20 can be a gradient coating with the relative proportions of at least two of the constituents varying through the coating. Alternatively, the second layer 20 can be formed by two or more separate coating layers, e.g., each layer being formed from one or more of the oxides constituents. For example, for a second layer 20 comprising oxides of silicon, tin, and phosphorous, each of these oxide layers can be deposited as a separate layer or two of the oxides can be deposited in one layer and the other oxide in another adjacent layer.

As discussed above, the second layer 20 can include mixtures of at least two oxides having elements selected from silicon, titanium, aluminum, tin, zirconium and/or phosphorus. Such mixtures include, but are not limited to, titania and phosphorous oxide; silica and alumina; titania and alumina; silica and phosphorous oxide; titania and phosphorous oxide; silica and tin oxide, tin oxide and phosphorous oxide, titania and tin oxide, alumina and tin oxide, silica and zirconia; titania and zirconia; alumina and zirconia; alumina and phosphorous oxide; zirconia and phosphorous oxide; or any combination of the above materials. The relative proportions of the oxides can be present in any desired amount, such as 0.1 wt. % to 99.9 wt. % of one material and 99.9 wt. % to 0.1 wt. % of the other material.

Additionally, the second layer 20 can include mixtures of at least three oxides, such as but not limited to, three or more oxides having elements selected from silicon, titanium, aluminum, tin, zirconium and/or phosphorus. Examples include, but are not limited to, mixtures comprising silica, titania and phosphorous oxide; silica, tin oxide and phosphorus oxide; silica, titania and alumina; and silica, titania and zirconia. For example, the second layer 20 can comprise a mixture of silica and titania with at least one other oxide selected from alumina, zirconia, and phosphorous oxide. For another example, the second layer 20 can comprise a mixture of silica and tin oxide with at least one other oxide selected from alumina, zirconia, and phosphorous oxide. In a further example, the second layer 20 can comprise a mixture of silica and phosphorous oxide with at least one other oxide selected from tin oxide and titania. The relative proportions of the oxides can be present in any desired amount, such as 0.1 wt. % to 99.9 wt. % of one material, 99.9 wt. % to 0.1 wt. % of a second material, and 0.1 wt. % to 99.9 wt. % of a third material.

One exemplary second layer 20 comprises a mixture of silica, titania, and phosphorous oxide. The silica can be present in the range of 30 volume percent (vol. %) to 80 vol. %. The titania can be present in the range of 5 vol. % to 69 vol. %. The phosphorous oxide can be present in the range of 1 vol. % to 15 vol. %. The second layer 20 can comprise a mixture of silica, titania, and phosphorous oxide having less than 40 mole percent titania, such as less than 30 mole percent titania, such as less than 25 mole percent titania, such as less than 20 mole percent titania.

Another exemplary second layer 20 comprises a mixture of silica, tin oxide, and phosphorous oxide. The silica can be present in the range of 30 volume percent (vol. %) to 80 vol. %. The tin oxide can be present in the range of 5 vol. % to 69 vol. % such as 30 vol. % to 50 vol. %, such as 40 vol. % to 45 vol. %, such as 40 vol. %. The phosphorous oxide can be present in the range of 1 vol. % to 15 vol. %. The second layer 20 can comprise a mixture of silica, tin oxide, and phosphorous oxide having less than 50 mole percent tin oxide, such as less than or equal to 40 mole percent tin oxide, such as less than 30 mole percent tin oxide, such as less than 20 mole percent tin oxide, such as less than 15 mole percent tin oxide, such as in the range of 15 mole percent to 40 mole percent tin oxide, such as 15 mole percent to 20 mole percent tin oxide.

The second layer 20 can have any desired thickness, such as but not limited to, 10 nm to 100 nm, such as 10 nm to 80 nm, such as 10 nm to 60 nm, such as 10 nm to 40 nm, such as 20 nm to 40 nm, such as 20 nm to 35 nm, such as 20 nm to 30 nm, such as 25 nm.

The TCO layer 22 comprises at least one conductive oxide layer, such as a doped oxide layer. For example, the TCO layer 22 can include one or more oxide materials, such as but not limited to, one or more oxides of one or more of Zn, Fe, Mn, Al, Ce, Sn, Sb, Hf, Zr, Ni, Zn, Bi, Ti, Co, Cr, Si or In or an alloy of two or more of these materials, such as zinc stannate. The TCO layer 22 can also include one or more dopant materials, such as but not limited to, F, In, Al, P, and/or Sb. In one non-limiting embodiment, the TCO layer 22 is a fluorine doped tin oxide coating, with the fluorine present in an amount less than 20 wt. % based on the total weight of the coating, such as less than 15 wt. %, such as less than 13 wt. %, such as less than 10 wt. %, such as less than 5 wt. %, such as less than 4 wt. %, such as less than 2 wt. %, such as less than 1 wt %. The TCO layer 22 can be amorphous, crystalline, or at least partly crystalline.

The TCO layer 22 can have a thickness greater than 200 nm, such as greater than 250 nm, such as greater than 350 nm, such as greater than 380 nm, such as greater than 400 nm, such as greater than 420 nm, such as greater than 470 nm, such as greater than 500 nm, such as greater than 600 nm. In one non-limiting embodiment, the TCO layer 22 comprises fluorine doped tin oxide and has a thickness as described above, such as in the range of 350 nm to 1,000 nm, such as 400 nm to 800 nm, such as 500 nm to 700 nm, such as 600 nm to 700 nm, such as 650 nm.

The TCO layer 22 (e.g., fluorine doped tin oxide) can have a surface resistivity of less than 15 ohms per square ($\Omega/\square$), such as less than 14$\Omega/\square$, such as less than 13.5$\Omega/\square$, such as less than 13$\Omega/\square$, such as less than 12$\Omega/\square$, such as less than 11$\Omega/\square$, such as less than 10$\Omega/\square$.

The TCO layer 22 can have a surface roughness (RMS) in the range of 5 nm to 60 nm, such as 5 nm to 40 nm, such as 5 nm to 30 nm, such as 10 nm to 30 nm, such as 10 nm to 20 nm, such as 10 nm to 15 nm, such as 11 nm to 15 nm. The surface roughness of the first coating 16 will be less than the surface roughness of the TCO layer 22.

The amorphous silicon layer 24 can have a thickness in the range of 200 nm to 1,000 nm, such as 200 nm to 800 nm, such as 300 nm to 500 nm, such as 300 nm to 400 nm, such as 350 nm.

The metal containing layer 26 can be metallic or can include one or more metal oxide materials. Examples of suitable metal oxide materials include, but are not limited to, oxides of one or more of Zn, Fe, Mn, Al, Ce, Sn, Sb, Hf, Zr, Ni, Zn, Bi, Ti, Co, Cr, Si or In or an alloy of two or more of these materials, such as zinc stannate. The metal containing layer 26 can have a thickness in the range of 50 nm to 500 nm, such as 50 nm to 300 nm, such as 50 nm to 200 nm, such as 100 nm to 200 nm, such as 150 nm.

The coating layers, e.g., the undercoating 16, TCO layer 22, amorphous silicon layer 24, and the metal layer 26 can be formed over at least a portion of the substrate 12 by any conventional method, such as but not limited to, spray pyrolysis, chemical vapor deposition (CVD), or magnetron sputtered vacuum deposition (MSVD). The layers can all be formed by the same method or different layers can be formed by different methods. In the spray pyrolysis method, an organic or metal-containing precursor composition having one or more oxide precursor materials, e.g., precursor materials for titania and/or silica and/or alumina and/or phosphorous oxide and/or zirconia, is carried in a suspension, e.g., an aqueous or non-aqueous solution, and is directed toward the surface of the substrate while the substrate is at a temperature high enough to cause the precursor composition to decompose and form a coating on the substrate. The composition can include one or more dopant materials. In a CVD method, a precursor composition is carried in a carrier gas, e.g., nitrogen gas, and is directed toward the heated substrate. In the MSVD method, one or more metal-containing cathode targets are sputtered under reduced pressure in an inert or oxygen-containing atmosphere to deposit a sputter coating over substrate. The substrate can be heated during or after coating to cause crystallization of the sputtered coating to form the coating.

In one non-limiting practice of the invention, one or more CVD coating apparatus can be employed at one or more positions in a conventional float glass ribbon manufacturing process. For example, CVD coating apparatus may be employed as the float glass ribbon travels through the tin bath, after it exits the tin bath, before it enters the annealing lehr, as it travels through the annealing lehr, or after it exits the annealing lehr. Because the CVD method can coat a moving float glass ribbon, yet withstand the harsh environments associated with manufacturing the float glass ribbon, the CVD method is particularly well suited to deposit coatings on the float glass ribbon in the molten tin bath. U.S. Pat. Nos. 4,853,257; 4,971,843; 5,536,718; 5,464,657; 5,714,199; and 5,599,387 describe CVD coating apparatus and methods that can be used in the practice of the invention to coat a float glass ribbon in a molten tin bath.

In one non-limiting embodiment, one or more CVD coaters can be located in the tin bath above the molten tin pool. As the float glass ribbon moves through the tin bath, the vaporized precursor composition can be added to a carrier gas and directed onto the top surface of the ribbon. The precursor composition decomposes to form a coating on the ribbon. The coating composition can be deposited on the ribbon at a location in which the temperature of the ribbon is less than 1300° F. (704° C.), such as less than 1250° F. (677° C.), such as less than 1200° F. (649° C.), such as less than 1190° F. (643° C.), such as less than 1150° F. (621° C.), such as less than 1130° F. (610° C.), such as in the range of 1190° F. to 1200° F. (643° C. to 649° C.). This is particularly useful in depositing a TCO layer 22 (e.g., fluorine doped tin oxide) having reduced surface resistivity since the lower the deposition temperature, the lower will be the resultant surface resistivity.

For example, to form a second layer 20 comprising silica and titania, the composition comprises both a silica precursor and a titania precursor. One non-limiting example of a silica precursor is tetraethylorthosilicate (TEOS).

Examples of titania precursors include, but are not limited to, oxides, sub-oxides, or super-oxides of titanium. In one embodiment, the titania precursor material can include one or more titanium alkoxides, such as but not limited to, titanium methoxide, ethoxide, propoxide, butoxide, and the like; or isomers thereof, e.g., titanium isopropoxide, tetraethoxide, and the like. Exemplary precursor materials suitable for the practice of the invention include, but are not limited to, tetraisopropyltitanate (TPT). Alternatively, the titania precursor material can be titanium tetrachloride. Examples of alumina precursors include, but are not limited to, dimethylaluminumisopropoxide (DMAP) and aluminum tri-sec-butoxide (ATSB). The dimethylaluminumisopropoxide can be made by mixing trimethylaluminum and aluminumisopropoxide at a molar ratio of 2:1 in an inert atmosphere at room temperature. Examples of phosphorous oxide precursors include, but are not limited to, triethyl phosphite and triethyl phosphate. Examples of zirconia precursors include, but are not limited to, zirconium alkoxides.

A second layer 20 having a combination of silica and titania provides advantages over previous oxide combinations. For example, the combination of a low refractive index material such as silica (refractive index of 1.5 at 550 nm) with a high refractive index material such as titania (refractive index of 2.48 for anatase titania at 550 nm) allows the refractive index of the first coating 16 to be varied between these two extremes by varying the amount of silica and titania. This is particularly useful in providing the first coating 16 with color or iridescence suppression properties.

However, the deposition rate of titania is typically much faster than that of silica. Under typical deposition conditions, this limits the amount of silica to no more than about 50 wt. %, which, in turn, limits the lower range of the refractive index of the resultant silica/titania coating. Therefore, a dopant material can be added to the silica and titania precursor composition to accelerate the deposition rate of silica. The dopant forms part of the resultant oxide mixture and, therefore, can be selected to provide enhanced performance properties to the resultant coating. Examples of dopants useful for the practice of the invention include, but are not limited to, materials containing one or more of phosphorous, aluminum, and zirconium to form oxides of these materials in the resultant coating. Examples of phosphorous oxide precursor materials include triethyl phosphite and triethyl phosphate. Examples of alumina precursor materials include aluminumtrisecbutoxide (ATSB) and dimethylaluminumisopropoxide (DMAP). Examples of zirconia precursors include zirconium alkoxide.

Figure 2:
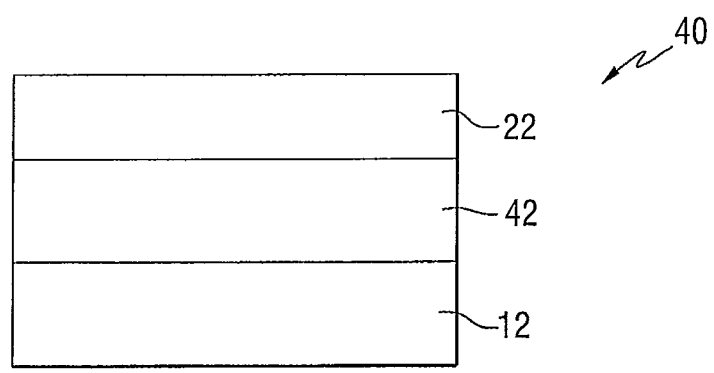
FIG. 2 is a side, sectional view (not to scale) of another coated article having an undercoating of the invention.

Another coated article 40 incorporating features of the invention is shown in FIG. 2. This article 40 is particularly useful for low emissivity or solar control applications. The article 40 includes a substrate 12, which can be as described above, such as a glass substrate. A gradient dielectric layer 42 is formed over at least a portion of the substrate 12. A TCO layer 22, as described above, can be formed over at least a portion of the dielectric layer 42. The dielectric layer 42 can include a mixture of two or more, for example three or more oxides, such as but not limited to, three or more oxides selected from oxides of silicon, titanium, aluminum, tin, zirconium and/or phosphorus. In one example, the dielectric layer 42 comprises a mixture of silica, titania, and phosphorous oxide, with the proportion of silica varying through the layer 42 and being higher near the surface of the substrate 12 and lower at the outer surface of the layer 42. The proportion of titania could be lower near the surface of the substrate 12 and higher at the outer surface of the layer 42. The proportion of phosphorous oxide could be substantially the same throughout the layer 42 or could also be varied as the silica or titania.

Figure 3:
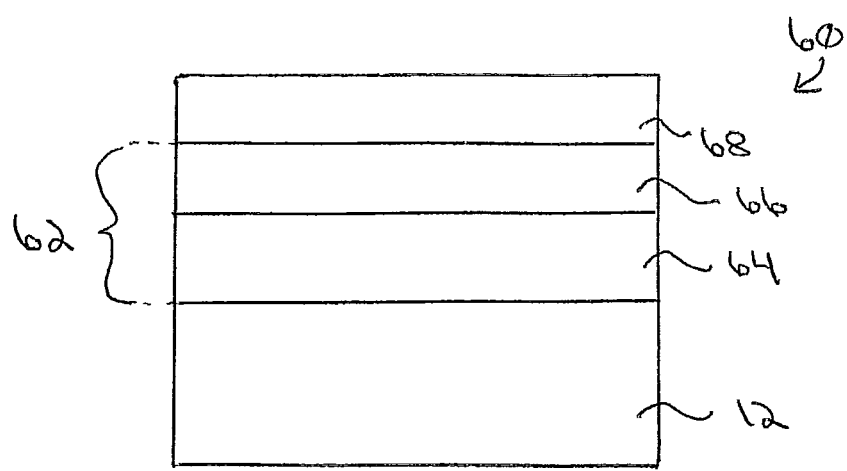
FIG. 3 is a side, sectional view (not to scale) of a further coated article of the invention.

Another coated article 60 is shown in FIG. 3. This article 60 is useful for low emissivity solar control applications, such as architectural glazings, e.g., solar control transparencies. The article 60 includes a substrate 12, which can be as described above, such as a glass substrate. For example, the substrate 12 can be a glass substrate having a thickness in the range of 3 mm to 3.5 mm, such as 3.2 mm.

An undercoating 62 is formed over at least a portion of the substrate 12. The undercoating 62 includes a first layer 64 and a second layer 66. The first layer 64 can be a metal oxide film, such as described above for the first layer 18. For example, the first layer 64 can be a tin oxide layer having a thickness in the range of 10 nm to 25 nm, such as 10 nm to 20 nm, such as 15 nm. The second layer 66 can be as described above for the second layer 20. For example, the second layer 66 can comprise a homogeneous mixed oxide film, such as a film containing a mixture of tin oxide, silica, and phosphorous oxide. The mixture can have tin oxide in the range of 35 mole percent to 50 mole percent, such as 35 mole percent to 45 mole percent, such as 40 mole percent. The second layer 66 can have a thickness in the range of 35 nm to 45 nm, such as 40 nm to 45 nm, such as 42 nm. As will be appreciated by one skilled in the art, the refractive index of a coating is largely dependent upon the percentage of tin oxide in the coating since there is a large difference of refractive index between tin oxide and either silica or phosphorous oxide. The refractive index difference between silica and phosphorous oxide is very small.

A TCO layer 68 is formed over the undercoating 62. The TCO layer 68 can be as described above for the TCO layer 22. For example, the TCO layer can be fluorine doped tin oxide as described above having a thickness in the range of 200 nm to 300 nm, such as 225 nm to 300 nm, such as 250 nm to 285 nm, for example, 280 nm to 290 nm, or 245 nm to 250 nm. The TCO layer 68 can have a surface roughness (RMS) in the range of 5 nm to 60 nm, such as 5 nm to 50 nm, such as 10 nm to 45 nm.

The article 60 is particularly well suited for architectural glazings. The article 60 has a color defined by an a* in the range of −2 to 0, such as −1.5 to 0, such as −1.2 to 0; a b* in the range of −5 to 0, such as −4.5 to 0, such as −3 to 0, such as −2 to 0; and an L* greater than 38, such as in the range of 38 to 45, such as 39 to 45, such as 39 to 44.

The following examples are provided to illustrate various non-limiting aspects of the invention. However, it is to be understood that the invention is not limited to these specific examples.

PROPHETIC EXAMPLE 1

A coated article comprises a clear glass substrate having a thickness of 3.2 mm. A layer of tin oxide having a thickness of 15 nm is formed over the substrate surface. A dielectric layer of silica, tin oxide, and phosphorous oxide is formed over the layer of tin oxide and includes 1 mole % to 40 mole % tin oxide. The dielectric layer has a thickness of 20 nm to 40 nm. A layer of fluorine doped tin oxide is formed over the dielectric layer and has a thickness of at least 470 nm. The coating layers are formed by CVD.

PROPHETIC EXAMPLE 2

A coated article comprises a clear glass substrate having a thickness of 3.2 mm. A layer of titania having a thickness of 10-15 nm is formed over the substrate surface. A dielectric layer of silica, titania, and phosphorous oxide is formed over the layer of titania and includes less than 25 mole % titania. The dielectric layer has a thickness of 20 nm to 40 nm. A layer of fluorine doped tin oxide is formed over the dielectric layer and has a thickness of at least 470 nm. The coating layers are formed by CVD.

PROPHETIC EXAMPLE 3

A coated article comprises a clear glass substrate having a thickness of 3.2 mm. A layer of tin oxide having a thickness of 15 nm is formed over the substrate surface. A dielectric layer of silica, tin oxide, and phosphorous oxide is formed over the layer of tin oxide and includes 15 mole % to 20 mole % tin oxide. The dielectric layer has a thickness of 25 nm. A layer of fluorine doped tin oxide is formed over the dielectric layer and has a thickness of 350 nm. The coating layers are formed by CVD.

EXAMPLE 4

A coated article has a clear glass substrate with a thickness of 3.2 mm. A layer of tin oxide with a thickness of 15 nm is formed over the substrate by CVD. A homogeneous mixed oxide layer of silica, tin oxide, and phosphorous oxide is formed over the tin oxide layer by CVD. The mixed oxide layer has 40 mole percent tin oxide and a thickness of 42 nm. A layer of fluorine doped tin oxide is formed over the mixed oxide layer by CVD. The fluorine doped tin oxide layer had a thickness of 285 nm. Assuming a surface roughness (RMS) of 10 nm with the roughened surface having 50 percent tin oxide and 50 percent air, the coating is calculated to have a color of a*=−1.5, b*=−4.5, and L*=43.87.

EXAMPLE 5

A coated article has a clear glass substrate with a thickness of 3.2 mm. A layer of tin oxide with a thickness of 15 nm is formed over the substrate by CVD. A homogeneous mixed oxide layer of silica, tin oxide, and phosphorous oxide is formed over the tin oxide layer by CVD and has 40 mole percent tin oxide and a thickness of 42 nm. A layer of fluorine doped tin oxide is formed over the mixed oxide layer by CVD and has a thickness of 250 nm. Assuming a surface roughness (RMS) of 45 nm with the roughened surface having 75 percent tin oxide and 25 percent air, the coating is calculated to have a color defined by a*=−1.2, b*=−2.0; and L*=39.39.

It will be readily appreciated by those skilled in the art that modifications may be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

The invention claimed is:

1. A coated article, comprising:
    a glass substrate;
    an anti-iridescent layer formed over at least a portion of the substrate, comprising:
        a first layer over a surface of the substrate and comprising tin oxide having a thickness in the range of 10 nm to 20 nm; and
        a homogeneous mixed oxide layer over the first layer and comprising a mixture of silica, tin oxide, and phosphorous oxide having a thickness in the range of 40 nm to 45 nm, and having 35 mole % to 45 mole % tin oxide; and
    a fluorine doped tin oxide layer over the mixed oxide layer and having a thickness in the range of 200 nm to 300 nm, wherein the coated article has a color defined by a* in the range of −2 to 0, b* in the range of −5 to 0, and L* in the range of 39 to 45.

2. The article of claim 1, wherein the first layer has a thickness of 15 nm and the mixed oxide layer has a thickness of 42 nm.

3. The article of claim 1, wherein the fluorine doped tin oxide layer has a thickness in the range of 280 nm to 290 nm.

4. The article of claim 1, wherein the fluorine doped tin oxide layer has a thickness in the range of 245 nm to 250 nm.

* * * * *